United States Patent [19]

Stegens

[11] 4,455,536

[45] Jun. 19, 1984

[54] PUSH-PULL MICROWAVE AMPLIFIER

[75] Inventor: Ronald E. Stegens, Brookeville, Md.

[73] Assignee: International Telecommunications Satellite Organization (INTELSAT), Washington, D.C.

[21] Appl. No.: 341,353

[22] Filed: Jan. 21, 1982

[51] Int. Cl.³ .......................... H03F 3/60; H03F 3/26
[52] U.S. Cl. ..................................... 330/286; 330/118
[58] Field of Search ................ 330/55, 286, 295, 287, 330/275, 120, 124 R, 149 US; 333/109, 256 US, 262 US, 1.1 US

[56] References Cited

U.S. PATENT DOCUMENTS

| | | | |
|---|---|---|---|
| 3,371,284 | 2/1968 | Engelbrecht | 330/31 |
| 3,649,927 | 3/1972 | Seidel | 330/124 |
| 3,665,333 | 5/1972 | Yastrov | 330/118 X |
| 3,739,294 | 6/1973 | Heynisch | 330/149 X |
| 3,825,843 | 7/1974 | Felsburg et al. | 330/149 X |
| 3,859,606 | 1/1975 | Peterson | 330/53 |
| 3,911,372 | 10/1975 | Seidel | 330/53 |
| 3,919,660 | 11/1975 | Beurrier | 330/185 |
| 4,016,503 | 4/1977 | Rambo | 330/124 D |
| 4,048,579 | 9/1977 | Carlsson | 330/151 |
| 4,309,666 | 1/1982 | Ito et al. | 330/286 |

Primary Examiner—James B. Mullins
Assistant Examiner—Steven J. Mottola
Attorney, Agent, or Firm—Sughrue, Mion, Zinn, Macpeak, and Seas

[57] ABSTRACT

A push-pull microwave amplifier in which an input signal is split into two transmission paths in a manner which simulates the behavior of a center-tapped transformer over a broad frequency range. The input signal is first divided into two identical paths and then passed down first and second transmission line segments in the two paths bi-directionally. One of the transmission line segments is terminated in an open circuit and the other in a short circuit so that the reflected signals have the opposite polarities. By making the transmission line segments of equal length, the opposite polarity signals emerge from the transmission line segments at the same time. The signals are then amplified and then passed again bi-directionally along third and fourth transmission line segments terminated in short and open circuits so as to re-convert the signals to the same polarity. The signals are then summed to produce the composite amplified output signal.

19 Claims, 6 Drawing Figures

PUSH-PULL MICROWAVE AMPLIFIER

BACKGROUND OF THE INVENTION

The invention pertains to a push-pull microwave amplifier. More particularly, the invention pertains to a push-pull microwave amplifier which is operable over a broad bandwidth.

To construct a true push-pull microwave amplifier, it is necessary to provide a driver circuit which simulates the behavior of a center-tapped transformer. This is illustrated in FIG. 1 in which an input waveform applied to a primary winding of a center-tapped transformer 10 induces signals across the two halves 14 and 16 of the secondary of the transformer 10 which track each other in magitude but with the opposite sign.

It is noted that, as illustrated in FIG. 2, it is not possible to simulate the behavior of a center-tapped transformer utilizing a simple 180° time delay such as may be achieved by disposing a 180° delay line in one of the output legs of a 3 dB phase splitter. In such a case, it is noted that the output signals are shifted in time from one another. That is, they do not simultaneously track each other in magnitude with opposite signs as is necessary for driving a true push-pull amplifier. To correctly drive a push-pull amplifier, it is desirable that an input signal be split into two halves which are precisely 180° different from one another, and not merely phase shifted with respect to one another, over all frequencies of interest.

In one prior art attempt to accomplish the desired function, as described in the article "A MIC Push-Pull FET Amplifier", Westinghouse Electric Corporation, Advanced Technology Laboratories, Baltimore, Md. and in U.S. Pat. No. 4,097,814 issued June 27, 1978 to Cohn, an MIC hybrid junction which is similar in operation to a well-known waveguide "magic tee" is known in which the junction is fabricated with a dielectric substrate with opposite planar faces metallized in a specific pattern. One face is completely metallized except for a "tee" shaped slot while the opposite face contains only a single microstrip line.

Another prior art approach, as described in the article "Coplanar Balun Circuits for GaAs FET High Power Push-Pull Amplifiers", 1973 IEEE G-MTT International Microwave Symposium, Boulder, Colo., June 4–6, 1973, pp. 309–311, a Balun circuit is utilized to convert a "hot" conductor/ground transmission line configuration to a two-conductor transmission line where both conductors are isolated from ground and currents flow equally in each conductor 180° out of phase with one another. The Balun circuit in that article is fabricated from three coplanar conductors supported by a dielectric substrate. Three parallel strip transmission lines extend from the center conductor into sides of an input coaxial line. At one-quarter wavelength from the juncture between the coaxial line and the three parallel strip lines, a short is made between the center conductor and one of the conductors connected to the ground side of the input coaxial line. The balanced line then continues from the other of the ground lines and the center conductor.

Both of these approaches suffer from the disadvantage that only narrow-band operation is achievable. Also, both of these approaches require a special form of microwave transmission line (a slotted line in the first-mentioned reference and a coplanar waveguide in the second). Moreover, neither of these techniques is usable in a "microstrip" circuit, the type of microwave integrated circuit in most common usage at the present time.

It is thus a primary object of the present invention to provide a microwave amplifier circuit in which an input signal is split into two halves which are 180° out of phase with one another over a wide bandwidth, wherein the behavior of a center-tapped transformer is accurately simulated.

It is a further object of the invention to provide such a microwave push-pull amplifier circuit in which only standard microwave "microstrip" circuit techniques are utilized.

SUMMARY OF THE INVENTION

In accordance with these, and other objects of the invention, there is provided a microwave amplifier circuit in which the behavior of a center-tapped transformer is accurately simulated over a broad bandwidth.

Specifically, in accordance with the invention, an input signal to the microwave amplifier circuit is split into two identical input signals which are coupled to first and second transmission line paths. The first and second transmission line paths both include transmission line segments along which the split input signals pass bi-directionally. The transmission line segment in one path is terminated in an open circuit while in the other transmission line path the transmission line segment is terminated with a short circuit. After passing through these transmission line segments, the signals in the two paths are amplified. Following amplification, the signals in the two paths are again passed through separate transmission line segments one of which is terminated in an open circuit and the other of which is terminated in a short circuit. The signals in the two paths are then combined to provide a composite amplified output signal.

In a first preferred embodiment, the signals from the main signal paths are coupled to and from the transmission line segments by microwave circulators. In another embodiment, the behavior of the microwave circulators is simulated by the use of hybrid couplers, specifically, 3 dB 90° (quadrature) hybrid couplers. However, any device which will simulate the behavior of a microwave circulator over the desired bandwidth can be utilized. Thus, as utilized herein, the term "microwave circulator device" or "microwave circulator means" refers to an actual microwave circulator or any device which simulates the action of a microwave circulator. In the case that hybrid couplers are utilized, transmission line segments are to be coupled to both ports on one side of the coupler.

DESCRIPTION OF THE PREFERRED EMBODIMENTS

Figure 1:
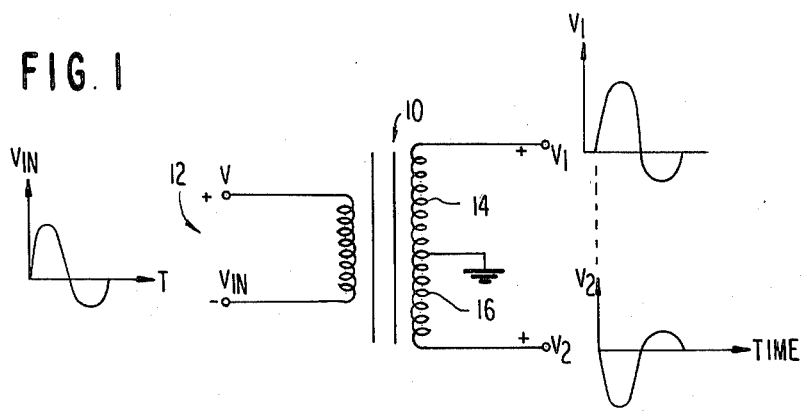
FIG. 1 shows a center-tapped transformer and the waveforms at the inputs and outputs of the center-tapped transformer.
Figure 2:
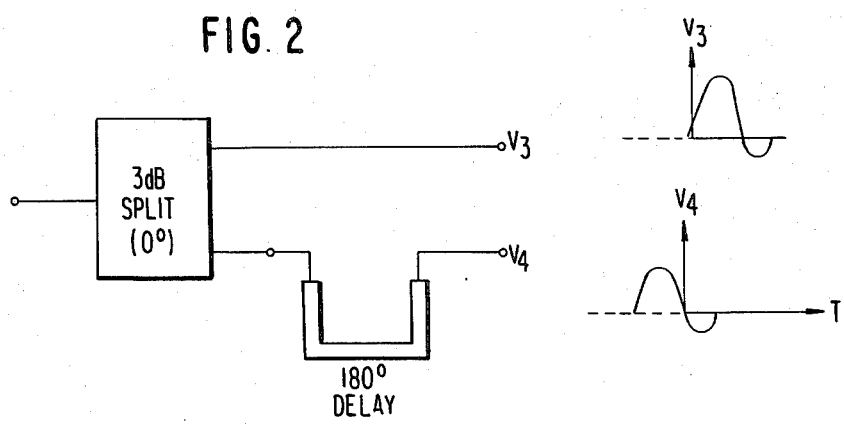
FIG. 2 illustrates a circuit in which a 180° delay line is coupled in one leg of the outputs from a power splitter, that device failing to adequately simulate the behavior of the center-tapped transformer of FIG. 1.
Figure 3:
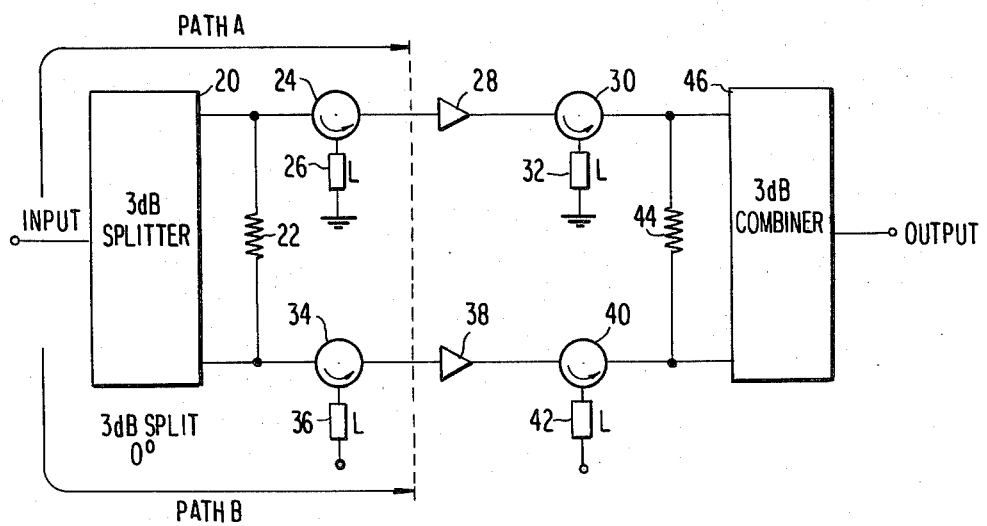
FIG. 3 is a circuit diagram of a first embodiment of a microwave amplifier device of the invention.

Referring now to FIG. 3, a first embodiment of a microwave amplifier device of the invention will now be described.

The input signal to be amplified is coupled to the input port of a 3 dB splitter 20, the two output ports of which are coupled to signal path A and signal path B. The two output ports of the 3 dB splitter 20 are terminated by a resistance 22 of the characteristic impedance of the lines. The signals in the two paths are then coupled to microwave circulators 24 and 34. The ports adjacent to the input ports of the microwave circulators 24 and 34 are connected to transmission lines 26 and 36 of length L. The length L is of no critical importance. It is only necessary that the transmission lines 26 and 36 be of the same length. The output ports from the microwave circulators 24 and 34 are coupled to the inputs of respective amplifiers 28 and 38. The amplifiers 28 and 38 are single ended and can be of any known design. The outputs from the amplifiers 28 and 38 are in turn coupled to the input ports of microwave circulators 30 and 40. As in the case of microwave circulators 24 and 34, the ports of the microwave circulators 30 and 40 adjacent the input ports are connected to transmission line segments 32 and 42, both again of length L. The transmission line segments 26 and 32 are terminated in a short circuit while the transmission line segments 36 and 42 are terminated in an open circuit so that they reflect signals with a true 180° phase difference between the two transmission paths. A resistance 44 of the characteristic impedance is coupled between the outputs of the microwave circulators 30 and 42 prior to the input of a second 3 dB combiner 46. The composite amplified output signal is produced on the output port of the 3 dB combiner 46.

Figure 4:
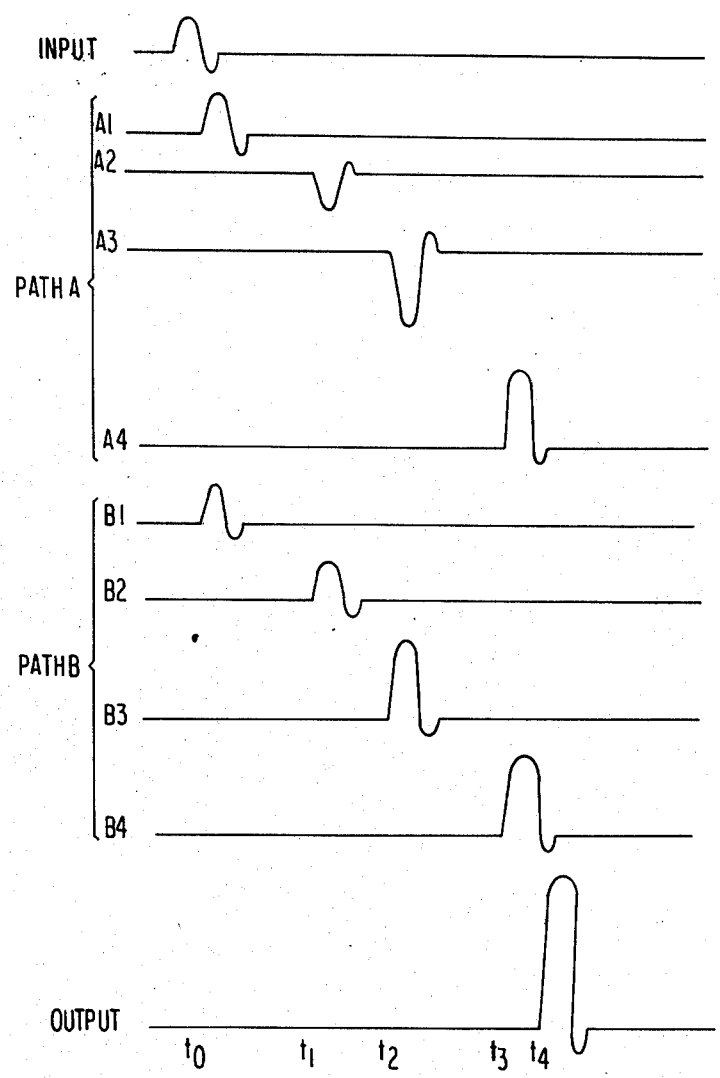
FIG. 4 is a waveform diagram used to illustrate the operation of the circuit of FIG. 3.

FIG. 4 is a waveform diagram used to illustrate the operation of the microwave amplifier shown in FIG. 3. It is to be recognized that the waveforms shown in FIG. 4 are in pulse form for simplicity although complex continuous analog waveforms would ordinarily be utilized in this circuit. The input signal is split by the first 3 dB splitter 20 into two signals $A_1$ and $B_1$ in paths A and B, respectively. The signal $A_1$ in path A propagates to the microwave circulator 24 and thence down and back the transmission line segment 26. At the end of the transmission line segment 26, the signal is reflected with a reflection coefficient of $-1$ due to the termination of the transmission line segment 26 in a short circuit. As a result, a signal $A_2$ emerges from the microwave circulator 24 at time $t_1$ having a polarity opposite that of the signal $A_1$. Similarily, in path B the signal $B_1$ passes to the microwave circulator 34 and thence down and back the transmission line segment 36. At the end of the transmission line segment 36, the signal is reflected with a reflection coefficient of $+1$ resulting in a signal $B_2$ emerging from the microwave circulator 34 at time $t_1$ which has the same polarity as the signal $B_1$.

The pulse signals $A_2$ and $B_2$ are amplified by respective amplifiers 28 and 38 at time $t_2$ prior to passing to the microwave circulators 30 and 40 to produce signals $A_3$ and $B_3$. The pulse signals $A_3$ and $B_3$ pass down and back their respective transmission line segments 32 and 42 to thereby produce signals $A_4$ and $B_4$ at the output ports of the circulators 30 and 40 at time $t_3$ which have the same polarity. The signals $A_4$ and $B_4$ are summed by the 3 dB combiner 46 (of the same structure as the 3 dB splitter 20) to produce an output signal at time $t_4$.

It is to be noted that the circuit of FIG. 3 can easily be implemented as a microwave integrated circuit utilizing standard techniques as there are no special components required.

The circuit of FIG. 3 can of course be altered in various ways within the scope of the present invention. For instance, the transmission line segments 26 and 36 do not have to be made the same length nor do the transmission line segments 32 and 42 have to be made the same length so long as the sum of the lengths of the transmission line segments 26 and 32 is the same as the sum of the lengths of the transmission line segments 36 and 42. Moreover, the 3 dB splitter 20 and the 3 dB combiner 46 can be replaced by hybrid couplers of an appropriate type if desired.

The 3 dB splitter 20 and the 3 dB combiner 46 may be Wilkenson-type power splitters, or any other type.

Figure 5:
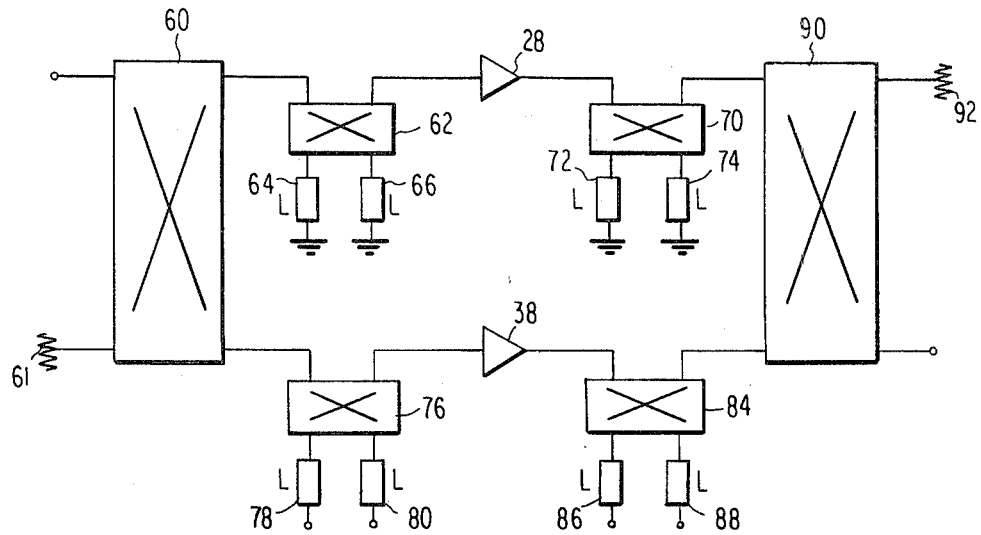
FIG. 5 is a circuit diagram of a second embodiment of a microwave amplifier of the invention.

Another embodiment of the invention is shown in the diagram of FIG. 5. In this embodiment, the 3 dB splitter 20 and the 3 dB combiner 46 have been replaced by hybrid couplers 60 and 90. The input signal is fed to one input port on one side of the hybrid coupler 60, the other port on the same side of which is terminated in a resistance 61. Similarly, the output signal is taken from a first port on one side of the hybrid coupler 90 with the other port on the same side of the hybrid coupler 90 being terminated in a resistance 92.

Also in this embodiment, the microwave circulators used in the first-described embodiment have been replaced by hybrid couplers 62, 70, 76 and 84. To provide the same electrical effect as the microwave circulators utilized in the embodiment of FIG. 3, two transmission line segments of equal length are coupled to the two ports on one side of the hybrid couplers 62, 70, 76 and 84 while the two ports on the other side of these hybrid couplers are coupled to the main transmission paths. Again as in the previously-described embodiment, the transmission line segments are preferably of equal length. The transmission line segments 64, 66, 72 and 74 are terminated in a short circuit while the transmission line segments 78, 80, 86 and 88 are terminated in open circuits.

It may be demonstrated mathematically that a hybrid coupler having two transmission line segments coupled thereto as shown in FIG. 5 is equivalent, at least ideally, to a microwave circulator and transmission line segment coupled thereto as in the embodiment of FIG. 3. Thus, the operation of the circuit of FIG. 5 is substantially the same as that of FIG. 3.

In the circuit of FIG. 5, all of the hybrid couplers may be of the 3 dB 90° (quadrature) type although the hybrid couplers 60 and 90 may be of the 3 dB 0° (Wilkenson) type. The hybrid couplers must be identical in pairs. Specifically, hybrid couplers 60 and 90 must be identical, hybrid couplers 62 and 76 must be identical, and hybrid couplers 70 and 84 must be identical.

The circuit of FIG. 5, although it requires more transmission line segments than the circuit of FIG. 3, may be advantageous in some situations as 90° hybrid couplers can be easily configured in any microwave integrated circuit format including "microstrip". These microwave integrated circuit hybrid couplers can be produced by etching techniques with tolerances of ±1% or better, thereby achieving good balance and very accurate push-pull operation over a wide bandwidth.

During fabrication, because they are terminated in an open circuit, the lengths of the transmission line segments 70, 80, 86 and 88 can easily be adjusted. To do this, the output from the hybrid coupler 90 can be observed and the lengths of the transmission line segments 78, 80, 86 and 88 adjusted until the output is optimized.

The circuit of FIG. 5 also possesses the feature of signals reflected from the inputs of amplifiers 28 and 38 being cancelled. In this embodiment, the signals reflected from the amplifiers 28 and 38 will appear in phase with one another at the two ports of the microwave hybrid coupler 60 (on the right-hand side of the hybrid coupler 60 as shown in the drawing of FIG. 5). However, by utilizing 3 dB quadrature hybrids, cancellation of reflected signals is achieved. The same is achieved at the output hybrid coupler 90.

Figure 6:
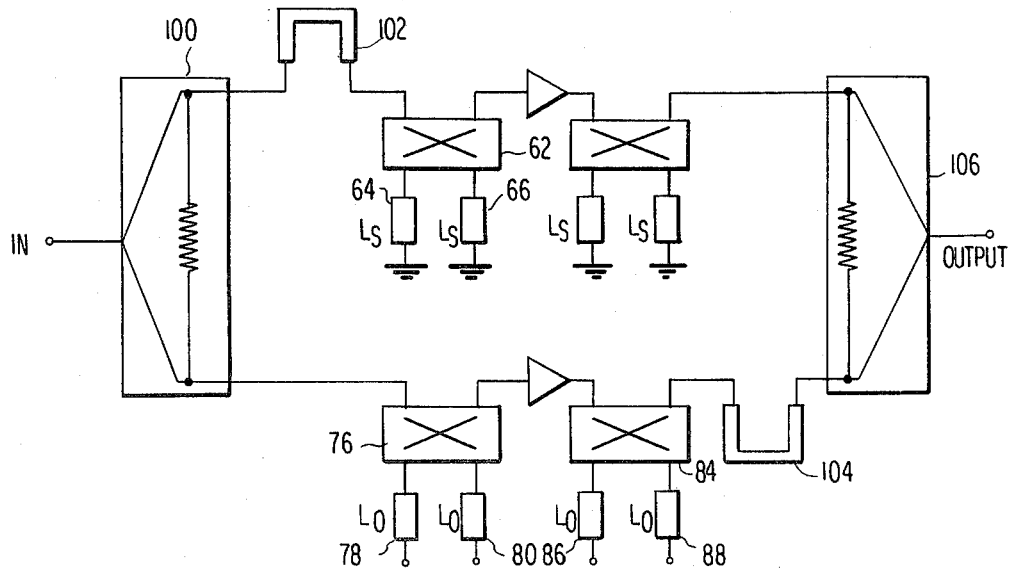
FIG. 6 is a circuit diagram of a third embodiment of a microwave amplifier device of the invention.

In the third embodiment shown in FIG. 6, delay lines 102 and 104, providing equal delay times, are inserted in the respective first and second transmission paths. So long as the delay lines 102 and 104 are of the same electrical length, although the signals in the two transmission paths are no longer in phase except just prior to being combined, the circuit operates the same as that shown in FIG. 5. In this embodiment, 0° power splitters 100 and 106 are utilized to achieve signal splitting and combining. Further, if the delay lines 102 and 104 are chosen to be 90° long at the operating frequency, cancellation of reflections will again be achieved at the input and output of the amplifier of FIG. 6, even though the hybrid couplers 100 and 106 are not of the quadrature type.

This completes the description of the preferred embodiments of the invention. Although preferred embodiments have been described, it believed that numerous modifications and alterations thereto would be apparent to one having oridinary skill in the art without departing from the spirit and scope of the invention.

I claim:

1. A push-pull microwave amplifier comprising:
   means for dividing an input signal into first and second paths;
   first and second reflecting means disposed respectively in said first and second paths, said first and second reflecting means reflecting signals in said first and second paths with opposite polarities;
   amplifying means disposed in each of said first and second paths; and
   means for combining outputs signals from said first and second paths to provide a composite amplified output signal.

2. The push-pull microwave amplifier of claim 1 wherein said first and second reflecting means have equal delay times.

3. The push-pull microwave amplifier of claim 2 wherein said first and second reflecting means each comprise first and second transmission line segments.

4. The push-pull microwave amplifier of claim 3 wherein one of said segments of each of said first and second reflecting means is disposed on either side of the associated amplifying means in the corresponding one of said first and second paths.

5. The push-pull microwave amplifier of claim 4 wherein said transmission line segments of said first reflecting means are terminated in short circuits and said transmission line segments of said second reflecting means are terminated in open circuits.

6. The push-pull microwave amplifier of claim 5 wherein the sum of the electrical lengths of said transmission line segments of said first reflecting means is equal to the sum of the electrical lengths of said transmission line segments of said second reflecting means.

7. The push-pull microwave amplifier of claim 5 wherein all of said transmission line segments have the same electrical length.

8. The push-pull microwave amplifier of any one of claims 1-7 further comprising microwave circulator means for coupling each of said transmission line segments to said first and second paths.

9. A push-pull microwave amplifier comprising:
   means for splitting an input signal into first and second equal signals in first and second transmission paths;
   a first microwave circulator having an input port coupled to receive said first equal signal in said first path;
   a first transmission line segment having a first end coupled to a port of said first microwave circulator adjacent said input port and a second and terminated in a short circuit;
   amplifying means receiving an input from an output port of said first microwave circulator;
   a second microwave circulator have an input port coupled to an output of said first amplifying means;
   a second transmission line segment having a first end coupled to a port of said second microwave circulator adjacent said input port of said second microwave circulator and a second end terminated in a short circuit;
   a third microwave circulator having an input port coupled to receive said second equal signal in said second path;
   a third transmission line segment having a first end coupled to a port of said third microwave circulator adjacent said input port of said third microwave circulator and a second end terminated in an open circuit;
   second amplifying means receiving an input from an output port of said third microwave circulator;
   a fourth microwave circulator having an input port coupled to an output of said second amplifying means;
   a fourth transmission line segment having one end coupled to a port of said fourth microwave circulator adjacent said input port of said fourth microwave circulator and a second end terminated in an open circuit; and
   means for combining output signals from said second and fourth microwave circulators to provide a composite amplified output signal.

10. The push-pull microwave amplifier of claim 9 wherein the sum of the electrical lengths of said first and second transmission lines segments is equal to the sum of the electrical lengths of said third and fourth transmission line segments.

11. The push-pull microwave amplifier of claim 9 wherein said first through fourth transmission line segments all have the same electrical length.

12. The push-pull microwave amplifier of any one of claims 9-11 wherein said means for splitting said input signal and said means for combining said output signals from said second and fourth microwave circulators both comprise 3 dB splitter means.

13. A push-pull microwave amplifier comprising;
   a first hybrid coupler, an input signal being connected to a first port on a first side of said first hybrid coupler and a second port on said first side of said first hybrid coupler being terminated with a resistance;

a second hybrid coupler having a first port on a first side coupled to a first port on a second side of said first hybrid coupler;

first and second transmission line segments having first ends coupled to respective first and second ports on a second side of said second hybrid coupler, said first and second transmission line segments being of equal electrical length and having second ends terminated in a short circuit;

first amplifying means having an input coupled to a second port on said first side of said second hybrid coupler;

a third hybrid coupler having a first port on a first side coupled to an output of said amplifying means;

third and fourth transmission line segments having first ends coupled to respective first and second ports on a second side of said third hybrid coupler, said third and fourth transmission line segments being of equal electrical length and having second ends terminated in a short circuit;

a fourth hybrid coupler having a first port on a first side thereof coupled to a second port on a second side of said first hybrid coupler;

fifth and sixth transmission line segments having first ends coupled to respective first and second ports on a second side of said fourth hybrid coupler, said fifth and sixth transmission line segments being of equal length and having second ends terminated in an open circuit;

second amplifying means having an input coupled to a second port on said first said of said fourth hybrid coupler;

a fifth hybrid coupler having a first port on a first side coupled to an output of said second amplifying means;

seventh and eighth transmission line segments having first ends coupled to respective first and second ports on a second side of said fifth hybrid coupler, said seventh and eighth transmission lines segments being of equal length and having second ends terminated in an open circuit; and a sixth hybrid coupler having a first port on a first side thereof coupled to a second port on said first side of said third hybrid coupler and having a second port on said first side thereof coupled to a second port on said first side of said fifth hybrid coupler, a composite amplified output signal being provided on a first port on a second side of said sixth hybrid coupler, and a second port on said second side of said sixth hybrid coupler being terminated in a resistance.

14. The push-pull microwave amplifier of claim 13 wherein the sum of the electrical lengths of said first through fourth transmission line segments is equal to the sum of the electrical lengths of said fifth through eighth transmission line segments.

15. The push-pull microwave amplifier of claim 13 wherein each of said first through eighth transmission line segments has the same electrical length.

16. The push-pull microwave amplifier of any one of claims 13–15 wherein said first and sixth hybrid couplers are identical, said second and fourth hybrid couplers are identical, and said third and fifth hybrid couplers are identical.

17. The push-pull microwave amplifier of any one of claims 13–15 wherein each of said first through sixth hybrid couplers is a 3 dB 90° hybrid coupler.

18. The push-pull amplifier of any one of claims 13–15 wherein said second through fifth hybrid couplers are each 3 dB 90° couplers and said first and sixth hybrid couplers are 3 dB 0° hybrid couplers.

19. The push-pull microwave amplifier of any one of claims 13–15 further comprising first and second delay line means disposed in said first and second transmission paths, respectively, said first and second delay line means being identical in electrical length.

* * * * *